United States Patent
Hsu et al.

[11] Patent Number: 6,134,150
[45] Date of Patent: Oct. 17, 2000

[54] ERASE CONDITION FOR FLASH MEMORY

[75] Inventors: Fu-Chang Hsu, Saratoga; Hsing-Ya Tsao, Santa Clara; Peter W. Lee, Saratoga; Vei-Han Chan; Hung-Sheng Chen, both of San Jose., all of Calif.

[73] Assignee: Aplus Flash Technology, Inc., Santa Clara, Calif.

[21] Appl. No.: 09/360,315

[22] Filed: Jul. 23, 1999

[51] Int. Cl.[7] ....................................................... G11C 7/00
[52] U.S. Cl. ................................ 365/185.29; 365/185.33; 365/226; 365/227; 365/218
[58] Field of Search .......................... 365/185.01, 185.29, 365/185.33, 218, 226, 227

[56] References Cited

U.S. PATENT DOCUMENTS

| | | | |
|---|---|---|---|
| 5,077,691 | 12/1991 | Haddad et al. | 365/218 |
| 5,438,542 | 8/1995 | Atsumi et al. | 365/182 |
| 5,485,423 | 1/1996 | Tang et al. | 365/185 |
| 5,598,369 | 1/1997 | Chen et al. | 365/185.27 |
| 5,617,357 | 4/1997 | Haddad et al. | 365/185.27 |
| 5,898,616 | 4/1999 | Ono | 365/185.17 |
| 5,962,890 | 10/1999 | Sato | 257/320 |
| 5,978,277 | 11/1999 | Hsu et al. | 365/185.29 |
| 6,005,809 | 12/1999 | Sung et al. | 365/185.29 |
| 6,009,017 | 12/1999 | Guo et al. | 365/185.28 |

*Primary Examiner*—Viet Q. Nguyen
*Attorney, Agent, or Firm*—George O. Saile; Stephen B. Ackerman

[57] ABSTRACT

In the present invention a flash memory configuration is disclosed that eliminates the need for one of two pump circuits that are commonly required to support an erase function of memory cells on a flash memory chip. The flash memory cells are placed into a triple well structure with a P-well contained within a deep N-well that resides on a P-substrate. The bias voltages for erase of the flash memory cells are chosen so as to require only one voltage pump circuit to be included in the flash memory chip. The chip bias, $V_{DD}$, is used for the source of the memory cells and a negative gate voltage is raised in magnitude to maintain the efficiency of the erase operation. The P-well is biased with a negative voltage that is sufficient to prevent the high negative voltage connected to the gate from causing breakdown in word line decoder circuits. The deep N-well and the P-substrate are biased such as to back bias the P/N junctions between the triple well structure.

13 Claims, 2 Drawing Sheets

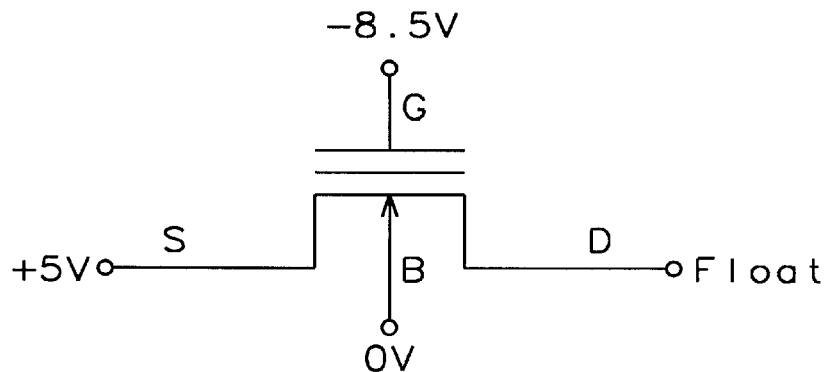
FIG. 1a – Prior Art
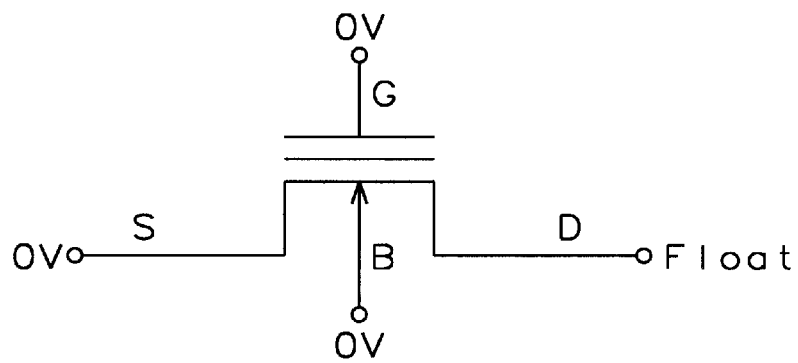
FIG. 1b – Prior Art
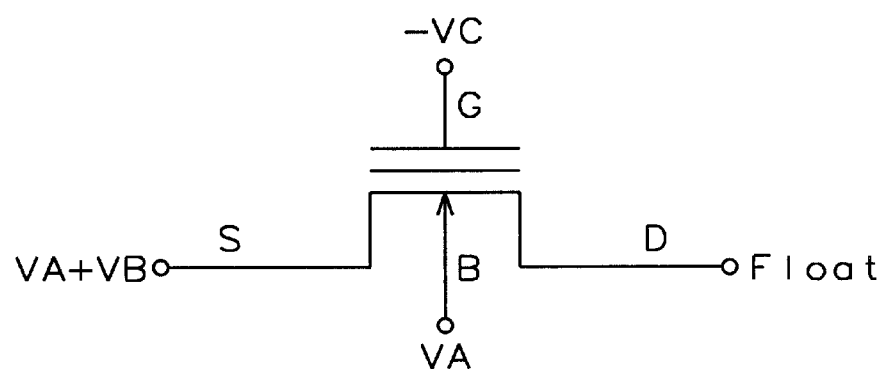
FIG. 2 – Prior Art

6,134,150

ERASE CONDITION FOR FLASH MEMORY

BACKGROUND OF THE INVENTION

1. Field of Invention

The present invention is related to semiconductor and in particular to flash memories and the conditions to erase a flash memory cell.

2. Description of Related Art

In a conventional erase condition for flash memory cells a high voltage is applied from the source to the gate of the cell. To accomplish the erasure of the cell, to avoid breakdown of the word line decoder and to perform the erasure at a reasonable rate, a high negative voltage is applied to the gate of the cell while a moderately high positive voltage greater in amplitude than the chip bias voltage is applied to the source. This requires that both a positive pump circuit and a negative pump circuit exist on the flash memory chip. There are several problems that must be handled when two pump circuits of opposite polarity are on the same chip. Besides increase in chip power considerable protection circuitry and guarding methodology are required to isolate the pump circuitry and avoid device breakdown.

In U.S. Pat. No. 5,485,423 (Tang et al.) discloses a conventional erase condition for a selected flash memory cell. In order to erase the selected cell, a high negative voltage of about −8.5V is applied to the gate, G, while a high positive voltage of about +5V is applied to the source, S, as shown in FIG. 1a. The drain, D, is left floating and the semiconductor bulk, B, is connected to ground. The high negative gate voltage and the high positive source voltages requires that two voltage pump circuits be contained on the flash memory chip to supply these voltages. The thirteen volts between the source and the gate produce a sufficient voltage to invoke Fowler-Nordheim tunneling and to erase the cell at an appropriate speed. In FIG. 1b of prior art is shown the voltages of prior art necessary to deselect the cell and prevent erase disturb conditions. As shown in FIG. 1b, zero volts are applied to the gate, G, the source, S, and the semiconductor bulk, B, with the drain, D, left floating.

In U.S. Pat. No. 5,438,542 (Atsumi et al.) a flash memory cell is formed on a P-type substrate with the bias conditions for erase shown in FIG. 2. The gate voltage is $-V_C$ and $V_A$ applied to the semiconductor substrate, $V_A+V_B$ applied to the source and the drain floating. This bias configuration requires two voltage pump circuits, one for $-V_C$ and one for $V_A+V_B$. The requirement for a chip to have for two pump circuits of opposite voltage creates a number of problems with which the design of the chip must take into consideration including isolation and avoid device break down. The extra power dissipation need to support two pump circuits is also a limitation.

SUMMARY OF THE INVENTION

In the present invention configuration and bias arrangement is disclosed which allows the erase of a flash memory cell which requires only one voltage that cannot be derived directly from the chip bias and requires one pump circuit. To accommodate the disclosed biasing scheme a P-well is formed within a deep N-well on a P-type semiconductor substrate. Located within the P-well is one or more flash memory cells having both a source and a drain located within the P-well and a stacked gate above the channel between the source and drain.

The external chip bias, $V_{DD}$, is connected to the source of the flash memory cells which eliminates the need for a positive voltage pump that is necessary for prior art as previously discussed. Reducing the source voltage to be within the chip bias puts a need on increasing the gate voltage by approximately an equal amount to maintain the speed at which the flash memory cell is erased. The gate bias is usually set near device breakdown which would affect the word line decoder circuitry. Adding to the gate voltage to compensate for the reduction in source voltage would cause breakdown problems for the decoder circuitry. This potential decoder breakdown problem is solved by lowering the voltage bias of the P-well from the normal zero volts to a negative voltage that is approximately the amount of voltage that the gate voltage was raised to compensate for loss of erase performance when the source was lowered to be within the chip bias voltage, $V_{DD}$.

A back bias is maintained on the P/N junctions of the multiple wells required to accommodate this invention. With the P-well biased at a voltage ranging from zero volts to a negative voltage, the deep N-well within which the P-well resides is connected to chip bias, $V_{DD}$. The semiconductor substrate upon which the deep N-well resides is biased at approximately zero volts to back bias the junction between the substrate and the N-well.

When a flash memory cell is not selected to be erased the gate and source are selected to prevent an erase disturb condition from another cell which is conditioned to be erased. To prevent an erase disturb applying the same approximate voltage to the gate, source and P-well with the drain floating keeps the deselected flash memory cell off and free from erase disturb form other cells. Since the P-well is biased to prevent breakdown in decoder circuitry, biasing the source and gate to this negative voltage maintains the integrity of the decoder circuitry and provides a bias for the deselected cells that can prevent erase disturb. It should be noted that the voltages used to deselect a cell need not be exactly the same, and can be slightly different as long as a proper margin of the deselected cell's threshold voltage shift is maintained against the disturb condition.

BRIEF DESCRIPTION OF THE DRAWINGS

This invention will be described with reference to the accompanying drawings, wherein:

FIG. 1a is the bias condition of a selected flash memory cell of prior art,

FIG. 1b is the bias condition of a deselected flash memory cell of prior art,

FIG. 2 is another bias condition of a selected flash memory cell of prior art,

DETAILED DESCRIPTION OF THE PREFERRED EMBODIMENT

Figure 3A:
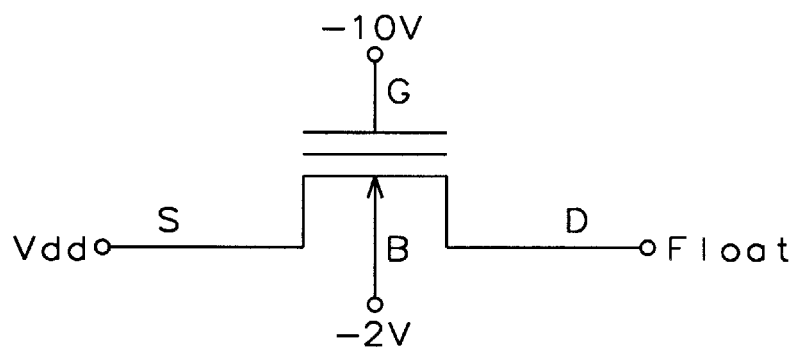
FIG. 3a is an approximate bias condition of a selected flash memory cell of this invention.

In FIG. 3a is shown a representative example of the voltage biasing scheme of this invention for a flash memory cell. The voltages shown should not be considered as the only possible combination of voltages but should be taken as an example. In prior art the source voltage is higher than the chip bias $V_{DD}$ which necessitates a second voltage pump circuit be added to be flash memory chip along the pump circuit to support the high negative gate voltage. This invention is about eliminating one of the two pump circuits required in prior art.

Continuing to refer to FIG. 3a, a selected stacked gate flash memory cell is shown with its respective applied voltage to erase the charge on the floating gate by means of Fowler-Nordheim tunneling. In order to eliminate one of the two pump circuits, the chip bias voltage $V_{DD}$ is connected to the source, S, with the drain, D, floating. The gate, G, is connected to a high negative voltage of approximately –10V. This is a voltage somewhat larger than the gate bias of prior art to compensate for the reduction in the source voltage to maintain the efficiency (speed) of the cell erasure. The gate voltage is supplied by the word line decoders and is in excess of circuit break down if the bulk, B, or in the case of this invention the P-well, is maintained at approximately zero volts. Therefore, the bulk B, is biased at –2V or a voltage that is approximately the amount of the increased magnitude of the gate voltage necessary to compensate for the reduction in the source voltage.

Figure 3B:
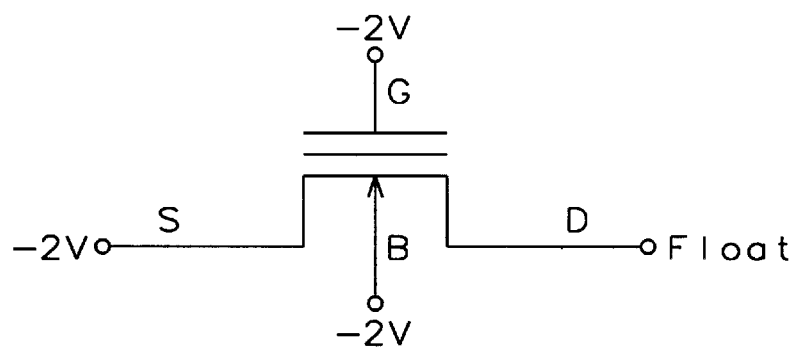
FIG. 3b is an approximate bias condition of a deselected flash memory cell of this invention.

Referring to FIG. 3b, a set of voltages are shown that deselect the stacked gate flash memory cell. Since one or more flash memory cells are in the same bulk, B, or P-well, the source, S, and the gate, G, are shown connected to the same voltage, –2V, as the bulk, B, which is approximate and is for illustrative purposes. The voltages of the bulk, B, the source, S, and the gate, G, do not have to be identical but need to be of such a value as to prevent significant erase disturb conditions to occur. With all of the cell terminals shown in FIG. 3b at approximately the same voltage the cell is off and erase disturb will not occur.

Figure 4:
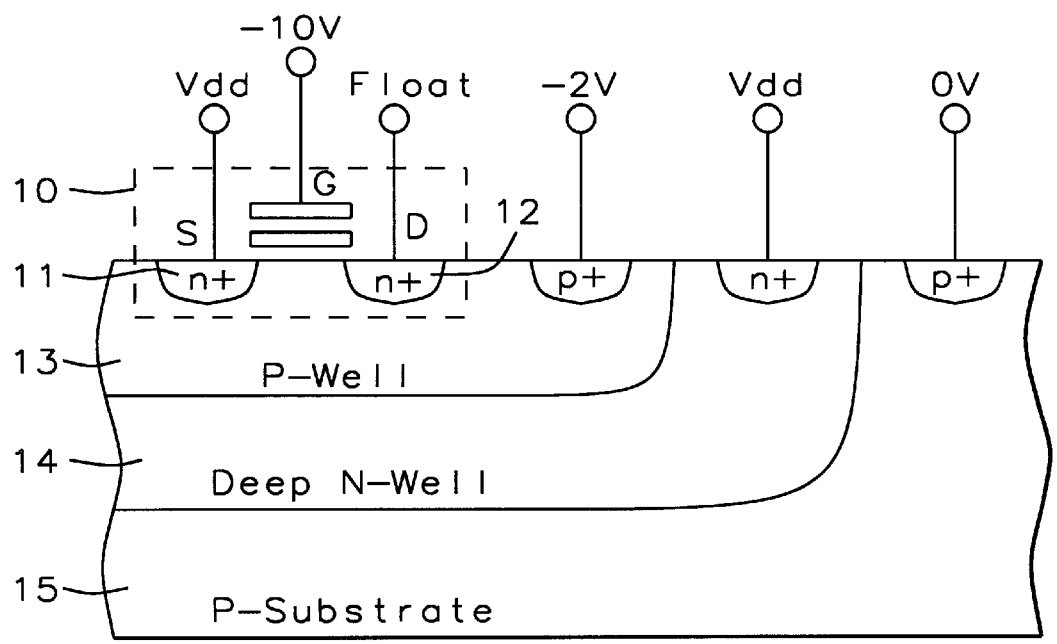
FIG. 4 is a diagram showing the stack gate flash memory cell with the multiple well structure and approximate bias conditions for this invention.

Referring to FIG. 4 a cross sectional view of a stacked gate flash memory cell 10 is shown. The n+ source 11 and the n+ drain 12 of the flash memory are located in a P-well 13. One ore more flash memory cells 10 can be located in the P-well 13. The P-well 13 is located in a deep N-well 14 which resides on a P-substrate 15. To erase the memory cell 10, the source, S, is connected to $V_{DD}$, the gate G, is connected to approximately –10V and the drain, D, is floating. The P-well 13 is biased to approximately –2V to prevent breakdown in the wordline decoder circuitry and the deep N-well 14 is biased to $V_{DD}$ to back bias the P/N junction between the P-well and the N-well. The semiconductor substrate 15 is biased to zero volts to back bias the P/N junction between the substrate and the N-well. Again it should be noted that the voltages shown in FIG. 4 are approximate and are for illustrative purposes.

While the invention has been particularly shown and described with reference to preferred embodiments thereof, it will be understood by those skilled in the art that various changes in form and details may be made without departing from the spirit and scope of the invention.

What is claimed is:

1. A method to erase flash memory cells while requiring the generation of only one voltage higher in magnitude than an external chip bias, $V_{DD}$, comprising:

a) reducing a voltage to $V_{DD}$ connected to a source of said selected flash memory cell to be erased and thereby eliminating a need for a positive voltage pump circuit, b) increasing a high negative voltage connected to a control gate of said selected flash memory cell to be erased by an amount equal to the reduction of said voltage connected to said source to maintain erase performance, c) applying a moderate negative voltage to semiconductor bulk of an approximate value equal to the increase in said high negative voltage to eliminate potential breakdown problems, d) floating a drain of said selected flash memory cell to be erased, e) erasing said selected flash memory cell by means of Fowler-Nordheim tunneling.

2. A method to erase flash memory cells while requiring the generation of only one voltage higher in magnitude than an external chip bias, $V_{DD}$, comprising:

a) applying a moderate negative voltage to a P-well contained within a deep N-well biased with $V_{DD}$ and contained on a P-substrate biased at zero volts, b) applying a high negative voltage to a control gate of selected flash memory cell to be erased, c) applying $V_{DD}$ to a source of said selected flash memory cell to be erased, d) floating a drain of said selected flash memory cell to be erased, e) erasing said selected flash memory cell by means of Fowler-Nordheim tunneling.

3. The method of claim 2, wherein applying said moderate negative voltage to said P-well is of such a magnitude to prevent breakdown of word line decoder circuitry when said high negative voltage is applied to said control gate.

4. The method of claim 2, wherein applying said moderate negative voltage to said P-well provides for an increased erasing speed.

5. The method of claim 1, wherein applying $V_{DD}$ to said source of said flash memory cells to be erased eliminates the need for a positive pump circuit.

6. A method to deselect flash memory cells from being erased on a chip, wherein said memory cells are erased using only one voltage higher in magnitude than external chip bias, $V_{DD}$, with a moderate negative voltage less in magnitude than $V_{DD}$ applied to semiconductor bulk containing said flash memory cell, comprising:

a) applying a moderate negative voltage to semiconductor bulk, b) applying said moderate negative bias to a control gate, and a source of a flash memory cell to be deselected, c) floating a drain of said flash memory cell to be deselected and deselecting said flash memory cell.

7. The method of claim 6, wherein applying said moderate negative voltage applies a voltage with a range from zero volts, or floating, to a voltage approximately equal to said external chip bias.

8. A method for erasing a flash memory cell, comprising:

a) forming a deep N-well in a P-type semiconductor substrate, b) forming a P-well in said deep N-well, c) forming a gate structure comprising a floating gate and a control gate above channel region of one or more of said flash memory cells, d) forming a source and drain of one or more flash memory cells bounding said channel region within said P-well, e) applying a moderate negative voltage to said P-well, $V_{DD}$ to said deep N-well, and zero volts to said semiconductor substrate, f) applying a high negative voltage to said control gate of said flash memory cells to be erased, g) applying $V_{DD}$ to said source of said flash memory cells to be erased, h) floating said drain of said flash memory cells to be erased, i) erasing stored charge on said floating gate of said flash memory cells to be erased by means of Fowler-Nordheim tunneling.

9. The method of claim 8, wherein applying $V_{DD}$ to said source of said flash memory cells to be erased eliminates the need for a positive pump circuit.

10. The method of claim 8, wherein applying said moderate negative voltage to said P-well is of such a magnitude to prevent breakdown of word line decoder circuitry when said high negative voltage is applied to said control gate.

11. The method of claim 8, wherein applying said moderate negative voltage to said P-well provides for an increased erasing speed.

12. A method to deselect flash memory cells from being erased on a chip, wherein said memory cells are erased using only one voltage higher in magnitude than external chip bias, $V_{DD}$, and a moderate negative voltage less in magnitude than $V_{DD}$ is applied to a P-well containing said flash memory cell, comprising:

a) applying a moderate negative voltage to a P-well contained within a deep N-well biased to an external chip bias, $V_{DD}$, wherein said N-well is residing on a P-substrate connected to ground, and wherein said moderate negative voltage has a magnitude less than external chip bias, $V_{DD}$, b) applying said moderate negative bias to a control gate, and a source of a flash memory cell to be deselected, c) floating a drain of said flash memory cell to be deselected, and deselecting said flash memory cell.

13. The method of claim 12, wherein applying said moderate negative voltage applies a voltage with a range from zero volts, or floating, to a voltage approximately equal to said external chip bias.

* * * * *